(12) United States Patent
Collins et al.

(10) Patent No.: US 10,651,117 B2
(45) Date of Patent: May 12, 2020

(54) LOW-INDUCTANCE CURRENT PATHS FOR ON-PACKAGE POWER DISTRIBUTIONS AND METHODS OF ASSEMBLING SAME

(71) Applicant: Intel Corporation, Santa Clara, CA (US)

(72) Inventors: Andrew Collins, Chandler, AZ (US); Jianyong Xie, Chandler, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 16/015,739

(22) Filed: Jun. 22, 2018

(65) Prior Publication Data

US 2019/0393142 A1    Dec. 26, 2019

(51) Int. Cl.
| | |
|---|---|
| *H01L 23/498* | (2006.01) |
| *H01L 23/42* | (2006.01) |
| *H01L 21/48* | (2006.01) |
| *H01L 25/16* | (2006.01) |
| *H01L 49/02* | (2006.01) |

(52) U.S. Cl.
CPC .... *H01L 23/49838* (2013.01); *H01L 21/4853* (2013.01); *H01L 23/42* (2013.01); *H01L 23/49827* (2013.01); *H01L 25/16* (2013.01); *H01L 28/40* (2013.01)

(58) Field of Classification Search
None
See application file for complete search history.

(56) References Cited

U.S. PATENT DOCUMENTS

| | | | |
|---|---|---|---|
| 2014/0085846 A1* | 3/2014 | Ma | H01L 23/15 361/762 |
| 2016/0133571 A1* | 5/2016 | Lee | H01L 25/0655 257/774 |
| 2017/0092575 A1* | 3/2017 | Manusharow | H01L 21/02263 |
| 2017/0229407 A1* | 8/2017 | Zu | G06F 17/5036 |

* cited by examiner

*Primary Examiner* — Mounir S Amer
(74) *Attorney, Agent, or Firm* — Schwegman Lundberg & Woessner, P.A.

(57) ABSTRACT

A micro-trace containing package substrate provides a low-inductance alternating-current decoupling path between a semiconductive device and a die-side capacitor.

18 Claims, 8 Drawing Sheets

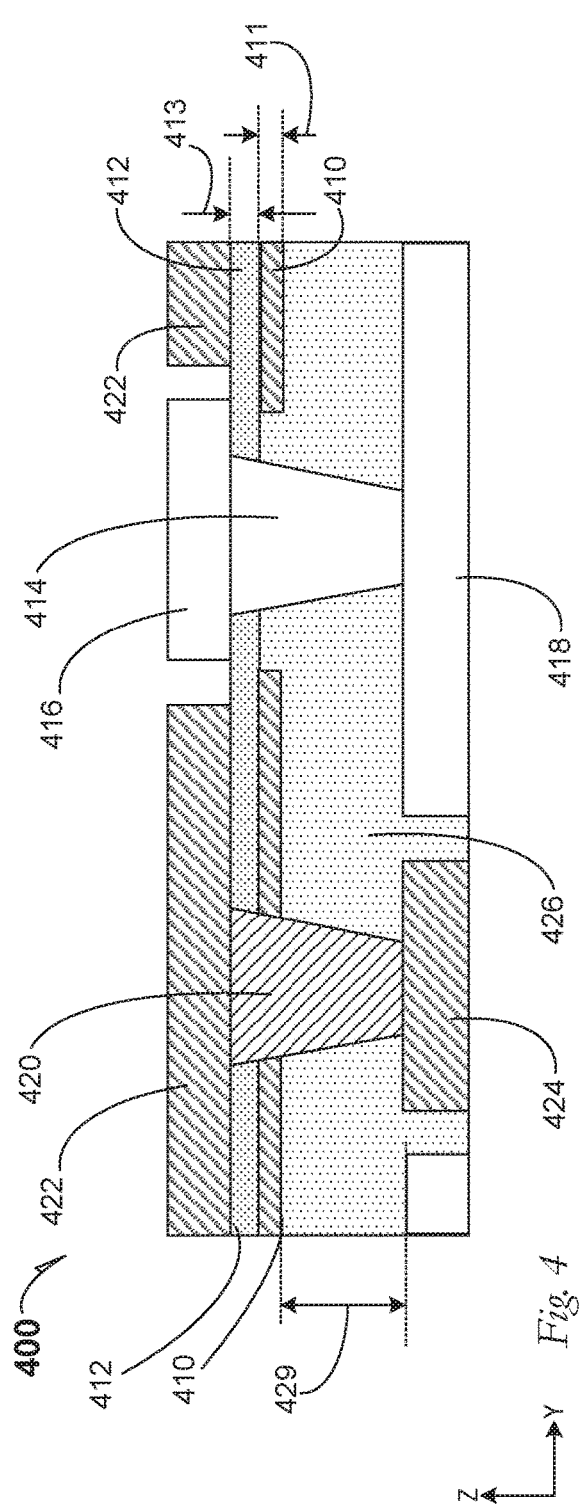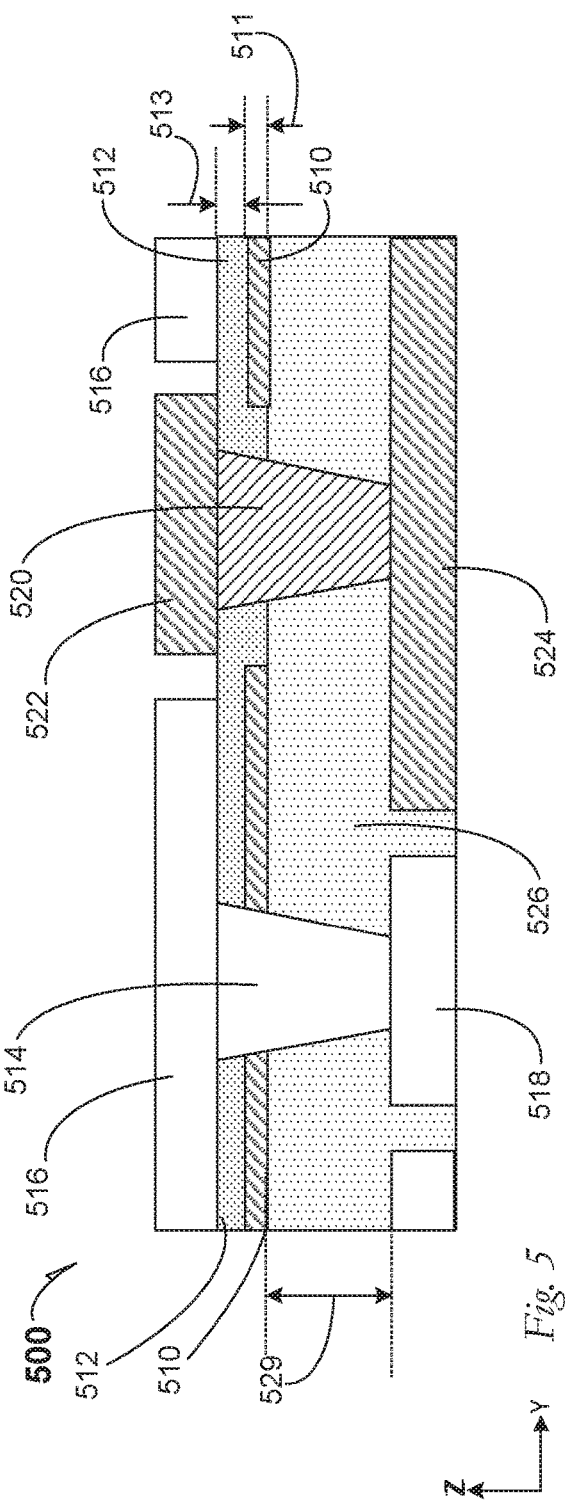

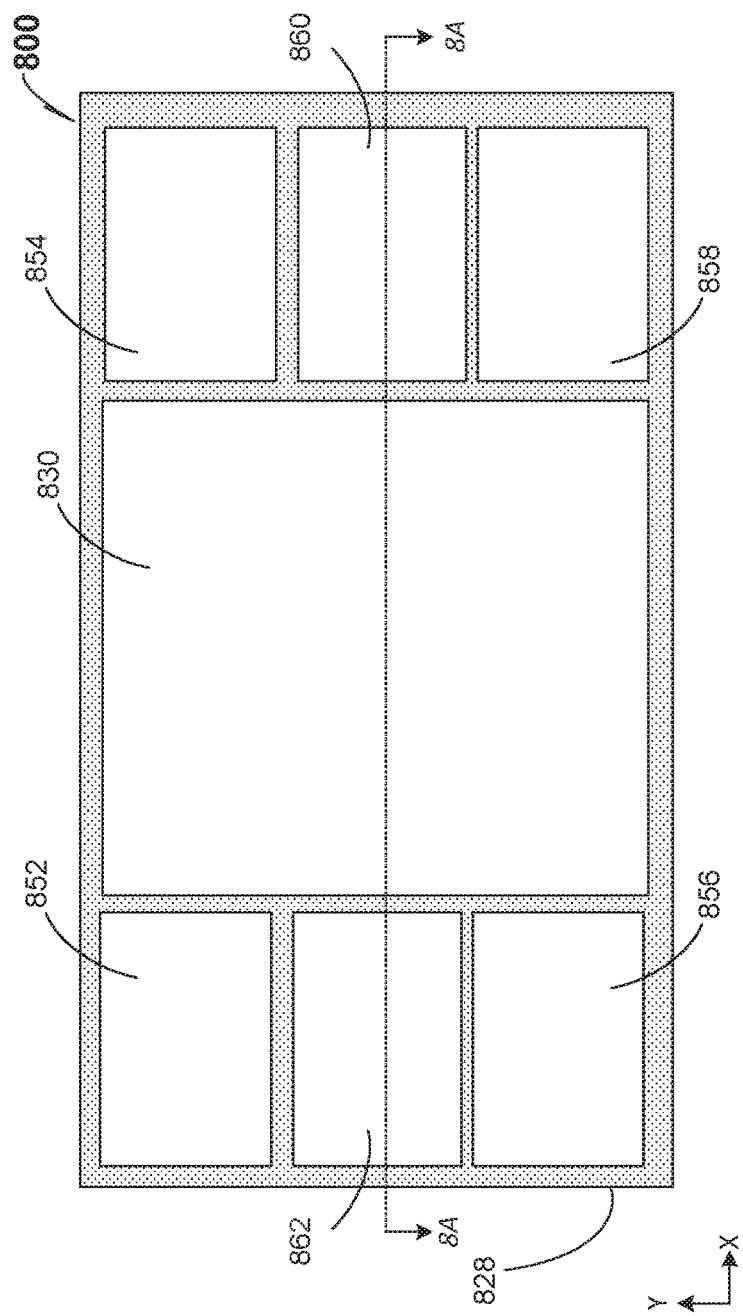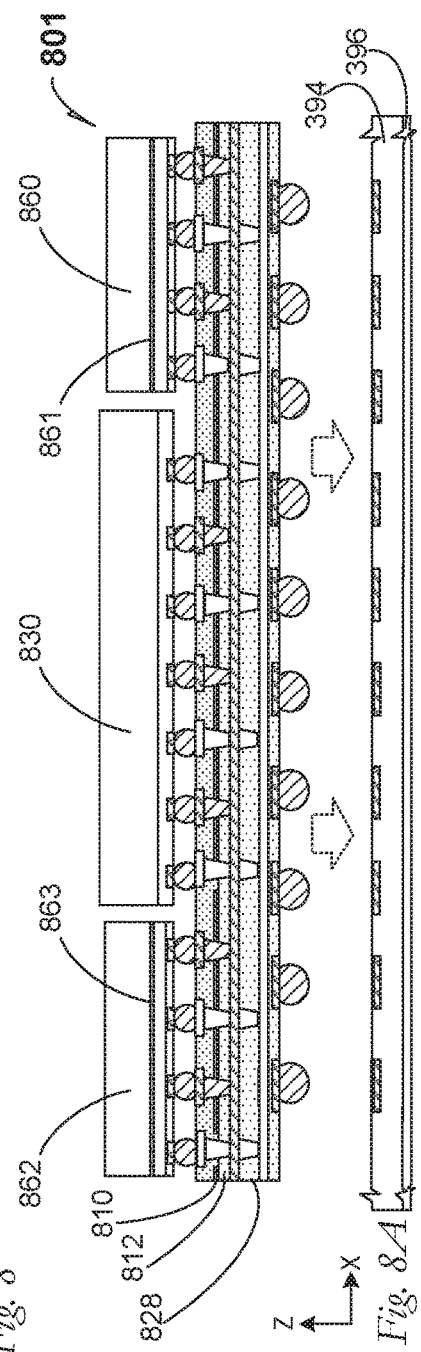

LOW-INDUCTANCE CURRENT PATHS FOR ON-PACKAGE POWER DISTRIBUTIONS AND METHODS OF ASSEMBLING SAME

FIELD

This disclosure relates to power delivery for semiconductor device packages.

BACKGROUND

Semiconductive device miniaturization connected to device packaging, includes challenges to allow high-speed and small volume interconnects between dice, and delivering power to the dice for capacitor-assisted power delivery.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 4 is a cross-section elevation of a semiconductor package substrate that includes a micro-Copper trace according to an embodiment;

FIG. 5 is a cross-section elevation of a semiconductor package substrate that includes a micro-Copper trace according to an embodiment;

FIG. 8 is a top plan of a semiconductor device package according to an embodiment;

FIG. 8A is a cross-section elevation of the semiconductor device package depicted in FIG. 8 according to an embodiment;

DETAILED DESCRIPTION

On-package alternating-current (AC) power delivery is provided in a low-inductance path, where access to die-side capacitors (DSCs) is provided for capacitance-on-die (Cdie) sharing in multi-chip packages (MCPs), such that capacitance-on-die is improved and land-side capacitors are not primarily used. The low-inductance current paths also preserve useful ball array populations on the land side of a semiconductor package substrate.

In several embodiments, an additional thin metal layer, such as micro-Copper (μCu) in the range from 2 to 10 micrometer (μm) is used with a dielectric layer that has a micro dielectric-layer thickness (μDL) in a range from 2 to 20 μm to facilitate low-inductance paths to die-side capacitors. Other trace thicknesses that are not the μCu trace, have a thickness in a range from 10 to 35 μm.

Disclosed are low-inductance AC paths that allow for DSCs and maximum die-to-component distances. Consequently in-semiconductor package substrate ("in-package") AC paths are disclosed, under the die shadows, with useful capacitance-on-die distribution between regions of a given die and die-side capacitors.

Figure 1:
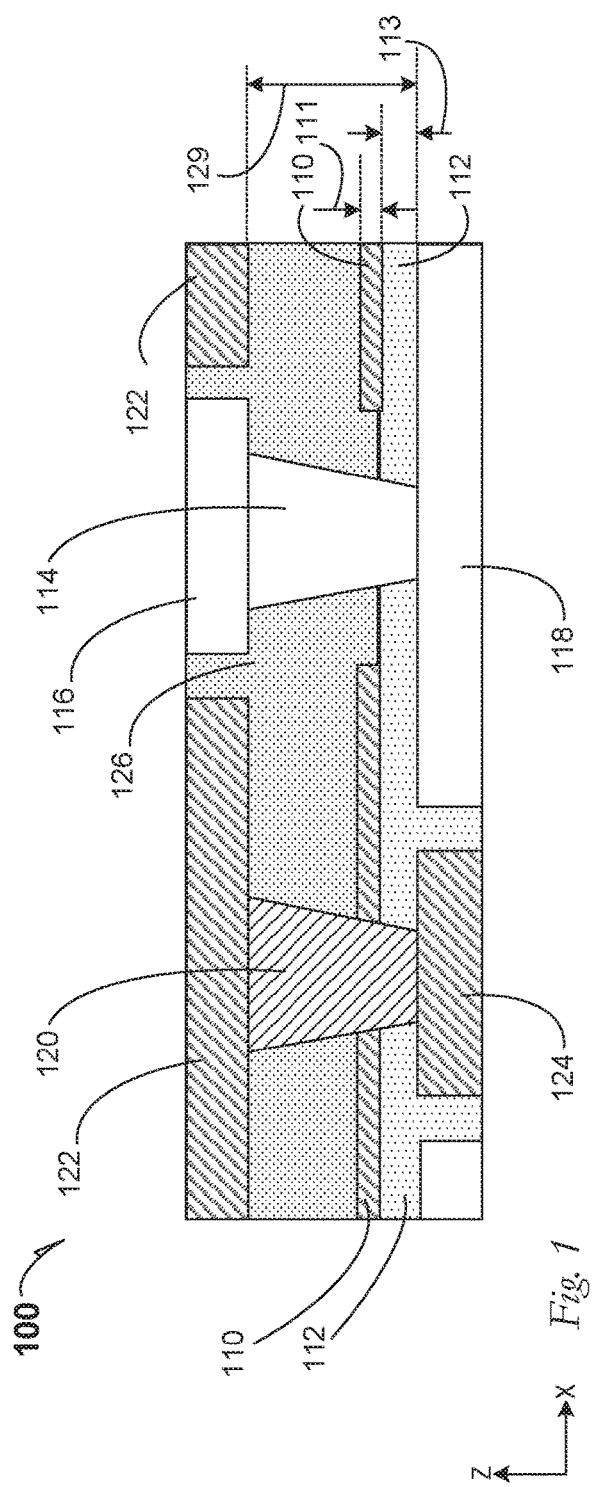
FIG. 1 is a cross-section elevation of a semiconductor package substrate that includes a micro-Copper trace according to an embodiment.

Disclosed embodiments include useful in-package paths including paths closer to the land side than to the die side, and where useful, vice versa. Other disclosed embodiments include MCPs with the low-inductance AC paths along μCu traces. Other disclosed embodiments include thermal-die MCPs with the low-inductance AC paths along μCu traces, where the thermal die occupies a keep-out zone (KOZ) equivalent space. In an embodiment, a μCu trace is made from a non-Copper material such as silver. Unless explicitly noted, the μCu trace embodiments are electronics-grade copper. In any event, the μCu trace may be referred to as a micro trace when compared to via traces within the semiconductor package substrate FIG. 1 is a cross-section elevation of a semiconductor package substrate 100 that includes a micro-Copper trace according to an embodiment. In an embodiment, a micro-Copper (μCu) trace 110 is formed above a micro dielectric layer (μDL) 112. A direct-current, power-supply (VCC DC) via 114 contacts a VCC top trace 116 and a VCC bottom trace 118. A direct-current voltage-source source (VSS DC) return path includes a VSS via 120 that contacts a VSS top trace 122 and a VSS bottom trace 124. In the illustrated embodiment, the μCu trace 110 is an alternating-current voltage-source source (VSS AC) return trace 110 that contacts the VSS DC via 120. The μCu trace 110 may also be referred to as a micro trace 110 because it is thinner when comparing thickness (Z-direction) to the top and bottom traces.

In an embodiment, the micro dielectric layer 112 is formed by spinning on dielectric material over the VCC DC bottom trace 118 and the VSS DC bottom trace 124, curing the dielectric material, and backgrinding or polishing to achieve a μDL thickness 113 above other structures. In an embodiment, the μDL 112 has a thickness that facilitates a useful inductance path from a landside capacitor. After configuring the μDL 112 with the useful μDL thickness 113, a thin VSS copper material is formed and patterned to a μCu trace thickness 111. In an embodiment, the μCu layer 110 has a thickness 111 in a range from 2-10 μm and the μDL 112 has a thickness 113 in a range from 4-20 μm.

A subsequent dielectric layer 126 is formed over the patterned μCu trace 110 and the μDL 112. In an embodiment, the subsequent dielectric layer 126 has a thickness 129 such as in a range from 25 μm to 40 μm. After forming the subsequent dielectric layer 126, the respective VCC DC and VSS DC vias 114 and 120 are formed by laser drilling into the subsequent dielectric layer 126 as well as the μCu trace 110 and the μDL, 112, stopping on the VCC DC bottom trace 118 and the VSS DC bottom trace 124, and filling such as by electroplating electronics grade copper. Where patterning of the μCu trace 110 creates voids, the VCC via 114 avoids shorting into the μCu trace 110.

The microvias that span two copper layers for the top and bottom traces, serve to connect the VSS alternating-current path that is supplied in the μCu layer 110. In an embodiment, location of the VSS layer 110 is closer to the respective bottom traces 118 and 124 than to the top traces 116 and 122.

Figure 2:
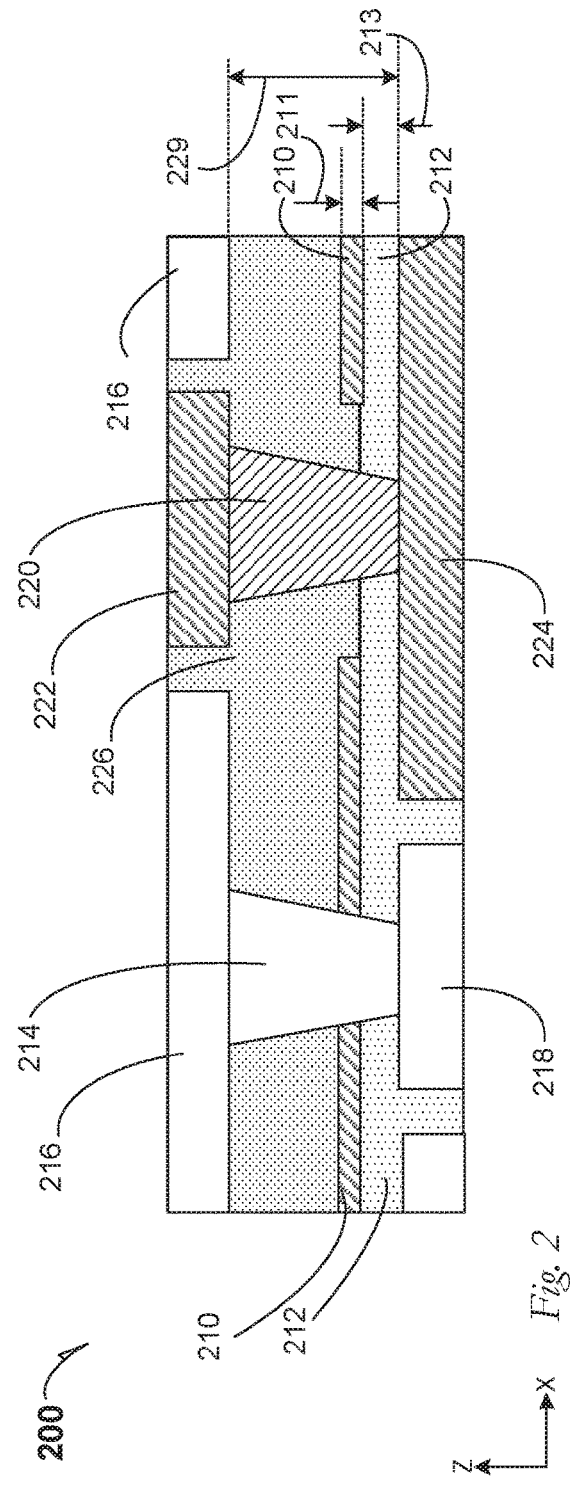
FIG. 2 is a cross-section elevation of a semiconductor package substrate that includes a micro-Copper trace according to an embodiment.

FIG. 2 is a cross-section elevation of a semiconductor package substrate 200 that includes a micro-Copper trace according to an embodiment. In an embodiment, a micro-Copper (μCu) trace 210 is formed above a micro dielectric layer (μDL) 212. A direct-current, power-supply (VCC DC) via 214 contacts a VCC top trace 216 and a VCC bottom trace 218. A direct-current voltage-source source (VSS DC) return path includes a VSS via 220 that contacts a VSS top trace 222 and a VSS bottom trace 224.

In an embodiment, the micro dielectric layer 212 is formed by spinning on dielectric material over the VCC DC bottom trace 218 and the VSS DC bottom trace 224, curing the dielectric material, and backgrinding or polishing to achieve a μDL thickness 213 above other structures. The μDL 212 has a thickness that facilitates useful inductance path to a landside capacitor.

In the illustrated embodiment, the μCu trace 210 is an alternating-current voltage-supply (VCC AC) supply trace 210 that contacts the VCC DC via 214.

After configuring the μDL, 212 with the useful μDL, thickness 213, a thin VCC copper material is formed and patterned to a μCu trace thickness 211.

A subsequent dielectric layer 226 is formed over the patterned μCu trace 210 and the μDL 212. In an embodiment, the subsequent dielectric layer 226 has a thickness 229 such as in a range from 25 μm to 40 μm. After forming the subsequent dielectric layer 226, the respective VCC DC and VSS vias 214 and 220 are formed by laser drilling into the subsequent dielectric layer 226 as well as the μCu trace 210 and the μDL 212, stopping on the VCC DC bottom trace 218 and the VSS DC bottom trace 224, and filling such as by electroplating electronics grade copper. Where patterning of the μCu trace 210 does not create voids, the VCC via 214 contacts the VCC AC μCu trace 210.

The microvias that span two copper layers for the top and bottom traces, serve to connect the VCC alternating-current path that is carried in the μCu layer 210. In an embodiment, location of the VCC μC layer 210 is closer to the bottom traces 218 and 224 than to the top traces 216 and 222.

Figure 3:
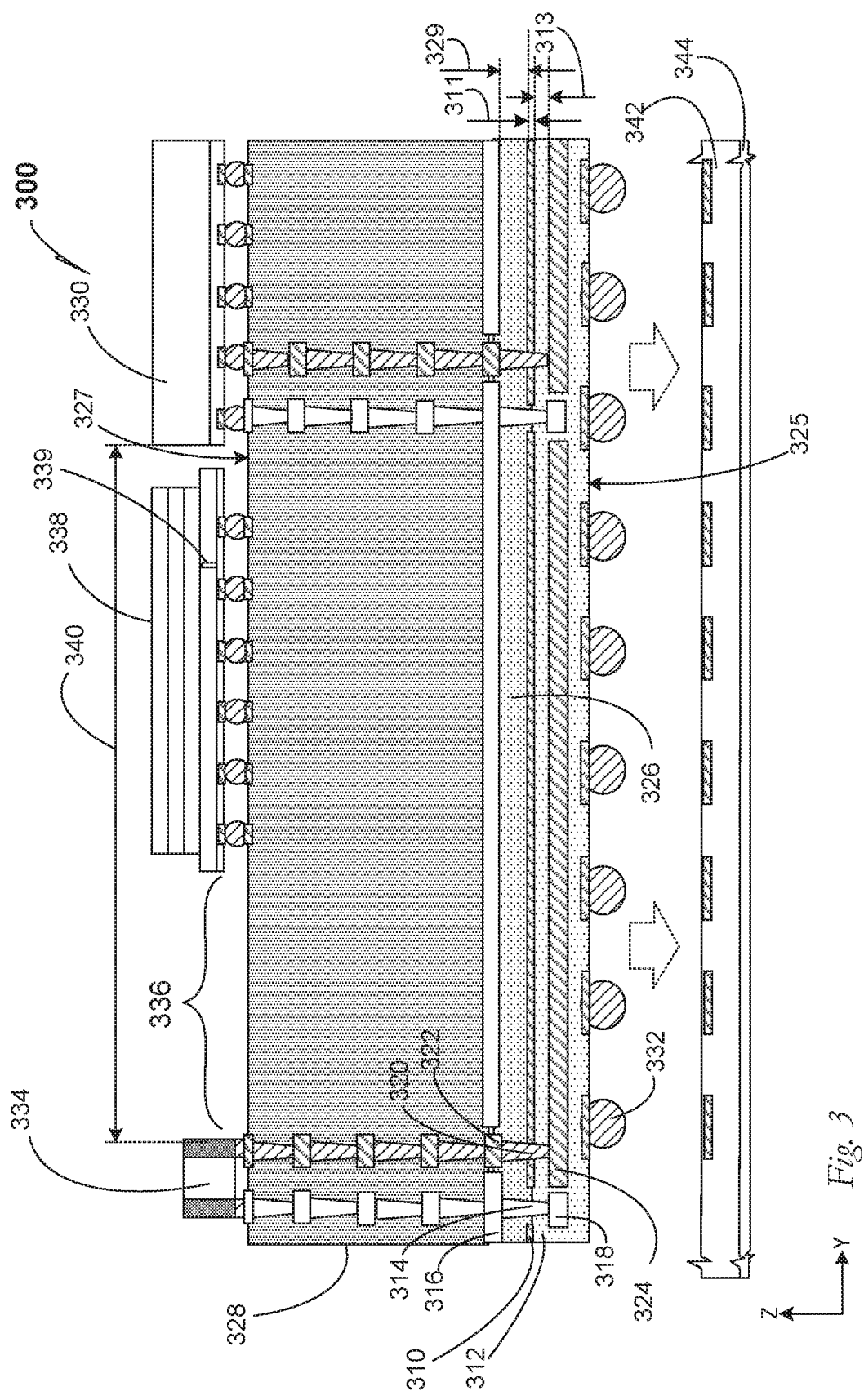
FIG. 3 is a cross-section elevation of at least a portion of a semiconductor device package according to an embodiment.

FIG. 3 is a cross-section elevation of at least a portion of a semiconductor device package 300 according to an embodiment.

In an embodiment, a micro-Copper (μCu) trace 310 is formed above a micro dielectric layer (μDL) 312. A direct-current, power-supply (VCC DC) via 314 contacts a VCC top trace 316 and a VCC bottom trace 318. A direct-current voltage-source source (VSS DC) return path includes a VSS via 320 that contacts a VSS top trace 322 and a VSS bottom trace 324. In the illustrated embodiment, the μCu trace 310 is an alternating-current voltage-source source (VSS AC) return trace 310 that contacts the VSS DC via 320.

In an embodiment, the micro dielectric layer 312 is formed by spinning on dielectric material over the VCC DC bottom trace 318 and the VSS DC bottom trace 324, curing the dielectric material, and backgrinding or polishing to achieve a μDL thickness 313 above other structures such as above a package core (not illustrated). The μDL 312 has a thickness 313 that facilitates a useful inductance path from a landside capacitor. After forming the μDL 312 with the useful μDL thickness 313, a thin VSS copper material is formed and patterned to a μCu trace thickness 311. In an embodiment, the micro trace 310 is a silver (Ag) material.

A subsequent dielectric layer 326 is formed over the patterned μCu trace 310 and the μDL 312 to form a subsequent dielectric layer thickness 329. Several IDLs are formed above the patterned μCu trace 310 (depicted generally in simplified form) and the μDL 312, until a die side 327 of semiconductor package substrate 328 supports a first semiconductive device 330, and a landside 325 of the semiconductor package substrate 328 supports a ball-grid array, one electrical bump of which is reference with numeral 332.

In an embodiment, a die-side capacitor 334 is seated on the die side 327 of the semiconductor package substrate 328, and a keep-out zone (KOZ) 336, as well as a memory-die stack 338 necessitate a capacitor-to-die horizontal distance 340. A KOZ is a space adjacent a flip-chip die edge, and optionally an adjacent component, where underfill material will flow, and where a portion of the underfill material will possibly remain. In any event, the KOZ 336 creates more lateral distance between, e.g. a die-side capacitor 334 and, e.g. a semiconductive device 330 it is servicing.

In an embodiment, the memory-die stack 338 includes a first larger die that is flip-chip mounted on the die side 327, and the first larger die includes a through-silicon via (TSV) 339 that begins communication to a stacked memory die; in this illustrated embodiment with three stacked memory dice. In an embodiment, the first larger die includes a memory-controller hub (MCH) in the semiconductive active area that is accessed by the TSV 339.

The vertical (Z-direction) scale is exaggerated for illustrative clarity, and the capacitor-to-die horizontal distance 340 amounts to a majority of the total decoupling path between the die-side capacitor 334 and the semiconductive device 330.

In an embodiment, the location of the μCu trace 310 is closer to the bottom traces 318 and 324 than to the top traces 316 and 320.

In an embodiment, the semiconductor package substrate 328 is assembled to a land 342 such as a motherboard 342. In an embodiment, the land 342 includes a shell 344 that provides at least one of physical and electrical-insulation protection to the semiconductive device 330.

In an embodiment, analysis of power delivery is done using the architecture depicted in FIG. 3, where the capacitor-to-die horizontal distance is 12.7 mm, a 2 μm thick μCu trace 310 and a 4 μm μDT 312 above a core layer (not illustrated) is carried out using the detail architecture depicted in FIG. 1. Compared to using a trace the thickness of the VSS DC bottom trace 124 of 15 μm Cu, loop inductance is lowered by about 60 picalenry (pH), AC impedance at the peak is reduced by about 4.6 milli Ohm (mOhm), and a baseline standard power-delivery path that required 23 die-side capacitors, with this analysis, uses eight die-side capacitors to match the AC impedance of the comparison package.

FIG. 4 is a cross-section elevation of a semiconductor package substrate 400 that includes a micro-Copper trace according to an embodiment. In an embodiment, a micro-Copper (μCu) trace 410 is formed before and below where a micro dielectric layer (μDL) 412 is to be formed. A direct-current, power-supply (VCC DC) via 414 contacts a VCC top trace 416 and a VCC bottom trace 418. A direct-current voltage-source source (VSS DC) return path includes a VSS via 420 that contacts a VSS top trace 422 and a VSS bottom trace 424. In the illustrated embodiment, the μCu trace 410 is an alternating-current voltage-source source (VSS AC) return trace 410 that contacts the VSS DC via 420.

In an embodiment, the micro dielectric layer 412 is formed by spinning on dielectric material over the μCu trace 410, curing the dielectric material, and backgrinding or polishing to achieve a μDL thickness 413 above other structures. The μDL 412 has a thickness that facilitates useful inductance path from a die-side capacitor. After forming the μDL 412 with the useful μDL thickness 413, a thin VSS copper material is formed and patterned to a μCu trace thickness 411. In and embodiment, the micro trace 410 is a silver (Ag) material.

A penultimate dielectric layer 426 is formed before and below where the patterned μCu trace 410 and the μDL 412 will be assembled. In an embodiment, the penultimate dielectric layer 426 has a thickness 429 such as in a range from 25 μm to 40 μm. After forming the μCu trace 410, the μDL 412 is configured the penultimate dielectric layer 426, the respective VCC DC and VSS DC vias 414 and 420 are formed by laser drilling into the penultimate dielectric layer 426, as well as the μCu trace 410 and the μDL layer 412, stopping on the VCC DC bottom trace 418 and the VSS DC bottom trace 424, and filling such as by electroplating electronics grade copper. Where patterning of the μCu trace 410 creates voids, the VCC via 414 avoids shorting into the μCu trace 410.

The microvias that span two copper layers for the top and bottom traces, serve to connect the VSS alternating-current path that is supplied by the μCu trace 410. In an embodiment, location of the VSS μCu trace 410 is closer to the top traces 416 and 422 than to the bottom traces 418 and 424.

FIG. 5 is a cross-section elevation of a semiconductor package substrate 500 that includes a micro-Copper trace according to an embodiment. In an embodiment, a micro-Copper (μCu) trace 510 is formed before and below where a micro dielectric layer (μDL) 512 is to be formed. A direct-current, power-supply (VCC DC) via 514 contacts a VCC top trace 516 and a VCC bottom trace 518. A direct-current voltage-source source (VSS DC) return path includes a VSS via 520 that contacts a VSS top trace 522 and a VSS bottom trace 524.

In an embodiment, the micro dielectric layer 512 is formed by spinning on dielectric material over the μCu trace 510, curing the dielectric material, and backgrinding or polishing to achieve a μDL thickness 513 above other structures. The μDL 512 has a thickness that facilitates useful inductance path to a die-side capacitor.

In the illustrated embodiment, the μCu trace 510 is an alternating-current voltage-supply (VCC AC) supply trace 510 that contacts the VCC DC via 514.

The μCu trace 510 is formed, followed by configuring the μDL 512 with the useful μDL thickness 513.

A penultimate dielectric layer 526 is formed before and below the patterned μCu trace 510 and the μDL 512 are formed. In an embodiment, the penultimate dielectric layer 526 has a thickness 527 such as in a range from 25 μm to 40 μm. After forming the penultimate dielectric layer 526, the respective VCC DC and VSS DC vias 514 and 520 are formed by laser drilling into the penultimate dielectric layer 526 as well as the μCu trace 510 and the μDL 512, stopping on the VCC DC bottom trace 518 and the VSS DC bottom trace 524, and filling such as by electroplating electronics grade copper. Where patterning of the μCu trace 510 does not create voids, the VCC via 514 contacts the VCC AC μCu trace 510.

The microvias that span two copper layers for the top and bottom traces, serve to connect the VCC alternating-current path that is provided by the μCu trace 510. In an embodiment, location of the VCC μCu trace 510 is closer to the top traces 516 and 522 than to the bottom traces 518 and 524.

Figure 6:
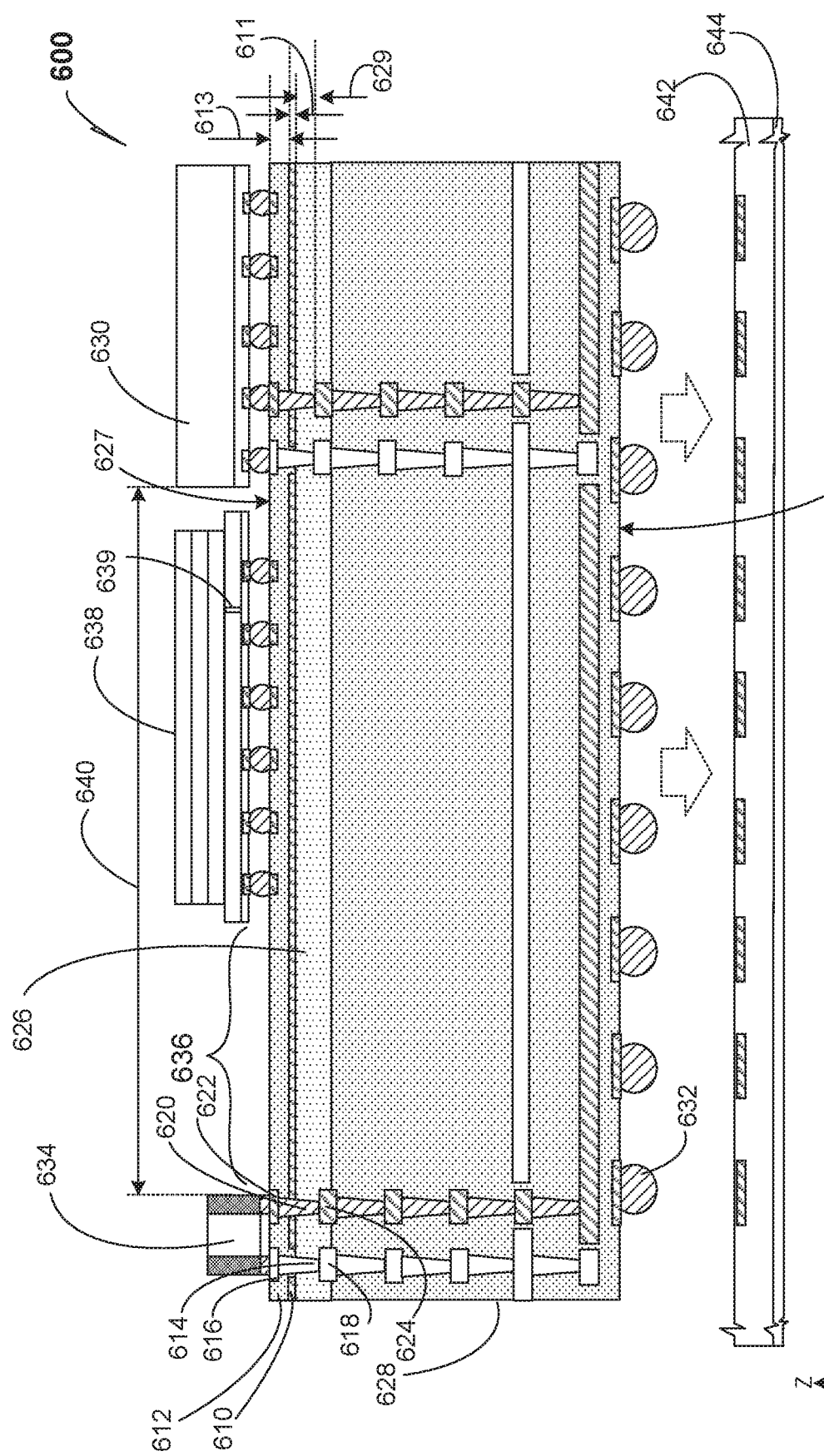
FIG. 6 is a cross-section elevation of at least a portion of a semiconductor device package according to an embodiment.

FIG. 6 is a cross-section elevation of at least a portion of a semiconductor device package 600 according to an embodiment.

In an embodiment, a micro-Copper (μCu) trace 610 is formed below a micro dielectric layer (μDL) 612. A direct-current, power-supply (VCC DC) via 614 contacts a VCC top trace 616 and a VCC bottom trace 618. A direct-current voltage-source source (VSS DC) return path includes a VSS via 620 that contacts a VSS top trace 622 and a VSS bottom trace 624. In the illustrated embodiment, the μCu trace 610 is an alternating-current voltage-source source (VSS AC) return trace 610 that contacts the VSS DC via 620.

In an embodiment, the micro dielectric layer 612 is formed by spinning on dielectric material over the μCu trace 610, curing the dielectric material, and backgrinding or polishing to achieve a μDL thickness 613 above other structures. The μDL 612 has a thickness 613 that facilitates a useful inductance path from a die-side capacitor. After forming the μDL 612 with the useful μDL thickness 313, a thin VSS copper material is formed and patterned to a μCu trace thickness 611. In an embodiment, the micro trace 610 is a silver (Ag) material.

A penultimate dielectric layer 626 is formed below and before the patterned μCu trace 610 and the μDL 612 are to be formed, and the penultimate dielectric layer 626 forms a penultimate dielectric layer thickness 629. Several IDLs are depicted generally and they are formed below the patterned μCu trace 610 and the μDL 612, and a die side 627 of a semiconductor package substrate 628 supports a first semiconductive device 630, and a landside 625 of the semiconductor package substrate 628 supports a ball-grid array, one electrical bump of which is reference with numeral 632.

In an embodiment, a die-side capacitor 634 is seated on the die side 627 of the semiconductor package substrate 628, and a keep-out zone 636, as well as a memory-die stack 638 necessitate a capacitor-to-die horizontal distance 640. In an embodiment, the memory-die stack 638 includes a first larger die that is flip-chip mounted on the die side 627, and the first larger die includes a through-silicon via (TSV) 639 that begins communication to a stacked memory die; in this illustrated embodiment with three stacked memory dice. In an embodiment, the first larger die includes a memory-controller hub (MCH) in the semiconductive active area that is accessed by the TSV 639.

The vertical (Z-direction) scale is exaggerated for illustrative clarity, and the capacitor-to-die horizontal distance 640 amounts to a majority of the total decoupling path between the die-side capacitor 634 and the semiconductive device 630. The location of the μCu trace 610 is closer to the top traces 616 and 620 than to the bottom traces 618 and 624 in a configuration as illustrated in FIG. 4.

In an embodiment, the semiconductor package substrate 628 is assembled to a land 642 such as a motherboard 642. In an embodiment, the land 642 includes a shell 644 that provides at least one of physical and electrical-insulation protection to at least the semiconductive device 630.

Figure 7:
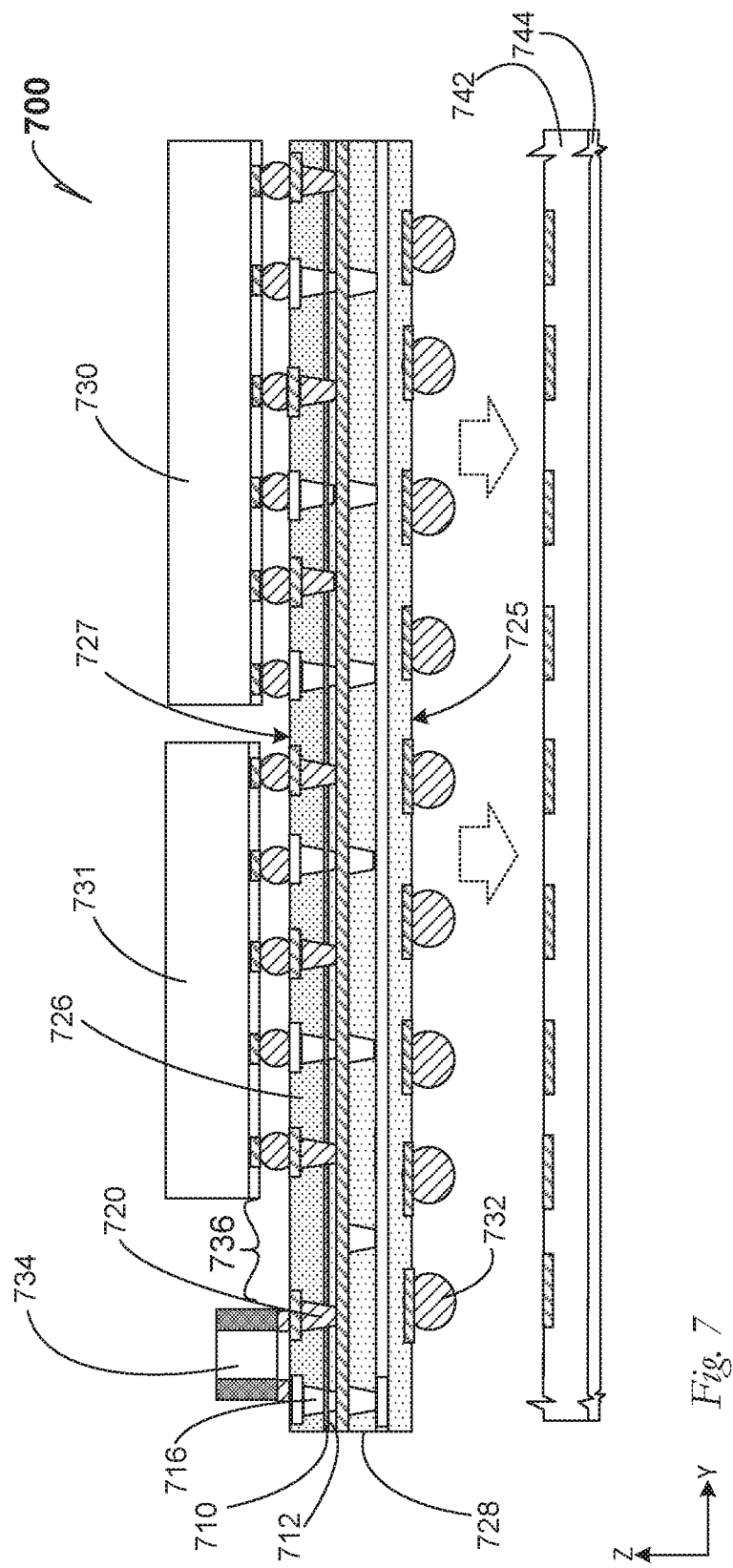
FIG. 7 is a cross-section elevation and partial projection of structures from at least a portion of a multi-chip semiconductor package according to an embodiment.

FIG. 7 is a cross-section elevation and partial projection of structures from at least a portion of a multi-chip semiconductor package (MCP) 700 according to an embodiment. Multiple dice such as multiple processors 730 and 731 are coupled to at least one die-side capacitor 734 according to an embodiment.

In an embodiment, a micro-Copper (μCu) trace 710 is formed above a micro dielectric layer (μDL) 712. A direct-current, power-supply (VCC DC) via 714 contacts a VCC top trace and a VCC bottom trace. A direct-current voltage-source source (VSS DC) return path includes a VSS via 720 that contacts a VSS top trace and a VSS bottom trace. In the illustrated embodiment, the μCu trace 710 is an alternating-current voltage-source source (VSS AC) return trace 610 that contacts the VSS DC via 720.

In an embodiment, the micro dielectric layer 712 is formed by spinning on dielectric material above other structures, curing the dielectric material, and backgrinding or polishing to achieve a μDL thickness. The μCu trace 710 is formed and patterned on the μDL 712. The μDL 712 has a thickness that facilitates a useful inductance path from a landside capacitor 734. After forming the μDL 712 with the useful μDL thickness, a thin VSS copper material 710 is formed and patterned to a μCu trace thickness. In an embodiment, the micro trace 710 is made from a silver (Ag) material.

A subsequent dielectric layer 726 is formed over the patterned μCu trace 710 and the μDL 712 to form a subsequent dielectric layer thickness. At least one interlayer dielectric (ILD) is formed below the patterned μCu trace 710 and the μDL 712. In an embodiment, a die side 727 of a semiconductor package substrate 728 supports the first semiconductive device 730 and the subsequent semiconductive device 731, and a landside 725 of the semiconductor package substrate 728 supports a ball-grid array, one electrical bump of which is reference with numeral 732.

In an embodiment, a die-side capacitor 734 is seated on the die side 727 of the semiconductor package substrate 728, and a KOZ 736 necessitates different capacitor-to-die horizontal distances for each of the semiconductive devices 730 and 731. In an embodiment, the μCu trace 710 is connected and configured as illustrated in FIG. 1. In an embodiment, the μCu trace 710 is connected and configured as illustrated in FIG. 2. In an embodiment, the μCu trace 710 is connected and configured as illustrated in FIG. 1. In an embodiment, the μCu trace 710 is connected and configured as illustrated in FIG. 4. In an embodiment, the μCu trace 710 is connected and configured as illustrated in FIG. 5.

In an embodiment, the location of the μCu trace 710 is closer to the top traces than to the bottom traces. In an embodiment as illustrated, the location of the μCu trace 710 is closer to the bottom traces than to the top traces.

FIG. 8 is a top plan of a semiconductor device package 800 according to an embodiment. In an embodiment, a multi-die complex used "dummy" dice to improve the multi-die arrangement, and to channel excess heat to a heat sink such as an integrated heat spreader. In an embodiment as keep-out zones are bridged as depicted in FIGS. 3 and 6, quick-voltage-droop issues are similarly addressed where the dummy dice essentially take up the space that otherwise would be the KOZs. Consequence, a low-conductance thermal path is enabled from metal-insulator-metal layers on the dummy dice that need supplemental capacitance-on-die. A low-inductance alternating-current path enables a useful connection to transfer the capacitance-on-die from the thermal dice to the main semiconductor device.

A first semiconductive device 830 is seated on a die side of a semiconductor package substrate 828, and several other semiconductive devices are also grouped near the first semiconductive device 830. In an embodiment a subsequent semiconductive device 852 is seated opposite a third semiconductive device 854 and across from the first semiconductive device 830. Further in an embodiment, a fourth semiconductive device 856 is seated opposite a fifth semiconductive device 858 and across from the first semiconductive device 830.

In an embodiment, heat management is facilitated by a first heat sink 860 (also referred to as a first thermal die 860 or "dummy die" 860) and a subsequent heat sink 862 (also referred to as a subsequent thermal die 862 or "dummy die" 862), across from the first semiconductive device 830. In an embodiment, the first thermal die 860 includes a metal-insulator-metal structure 861 that provides decoupling capability. In an embodiment, the subsequent thermal die 862 includes a metal-insulator-metal structure 863 that provides decoupling capability, By placing the first thermal die 860 and the subsequent thermal die 862 near the first semiconductive device 830, and also near the semiconductive devices 852, 854, 856 and 858, heat management is facilitated, as well as low-inductance AC pathways are enabled between die-side capacitors and the main semiconductive device 830.

FIG. 8A is a cross-section elevation of the semiconductor device package 800 depicted in FIG. 8 according to an embodiment. The cross-section view is taken from FIG. 8A along the section line 8A-8A. In an embodiment, a μCu trace 810 is coupled to the first semiconductive device 830 as well as to the first and subsequent thermal dice 860 and 862. In an embodiment, the first thermal die 860 includes a metal-insulator-metal structure 861 that provides decoupling capability. In an embodiment, the subsequent thermal die 862 includes a metal-insulator-metal structure 863 that provides decoupling capability.

As illustrated in an embodiment, the μCu trace 810 is an AC trace similar in configuration any of the AC configurations depicted in any of FIGS. 1, 2, 3, 4, 5 and 6.

Figure 9:
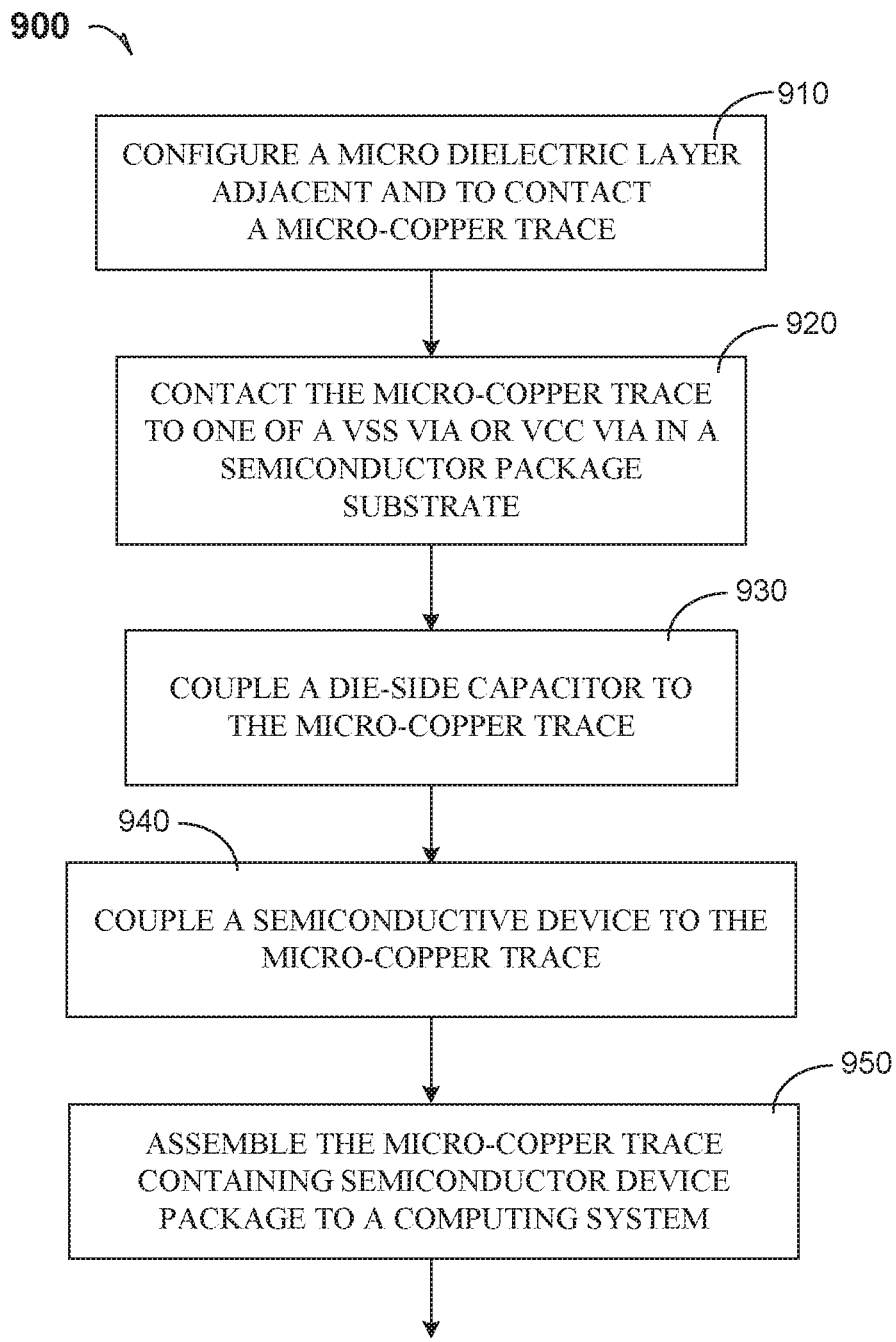
FIG. 9 is a process flow diagram according to several embodiments.

FIG. 9 is a process flow diagram 900 according to several embodiments.

At 910, the process includes configuring a micro dielectric layer to contact a micro-copper trace. In a non-limiting example embodiment, the μDL 112 is spun on, cured and thinned to the thickness 113, and a μCu trace 110 is formed above and on the μDL 112. In a non-limiting example embodiment, the μDL 412 is spun on, cured and thinned to the thickness 113, below the μCu trace 310.

At 920, the process includes contacting the micro-copper trace to one of a VSS DC via and VCC DC via in a semiconductor package substrate. In a nonlimiting example embodiment, the VSS DC via 120 is formed by laser drilling to expose the VSS bottom trace 124 and filling in the via 120 to contact the VSS AC μCu trace 110. In a nonlimiting example embodiment, the VCC DC via 214 is formed by laser drilling to expose the VCC bottom trace 218 and filling in the via 214 to contact the VCC AC μCu trace 210.

At 930, the process includes coupling a die-side capacitor to the μCu trace. In a non-limiting example embodiment, the μCu trace 310 is coupled to the die-side capacitor 334. In a non-limiting example embodiment, the μCu trace 610 is coupled to the die-side capacitor 634.

At 940, the process includes coupling the μCu trace to a semiconductive device. In a non-limiting example embodiment, the semiconductive device 330 is coupled to the μCu trace 310, and consequently the semiconductive device 330 is coupled to the die-side capacitor 334 through the μCu trace 310.

At 950, the process includes assembling the semiconductive device to a computing system.

Figure 10:
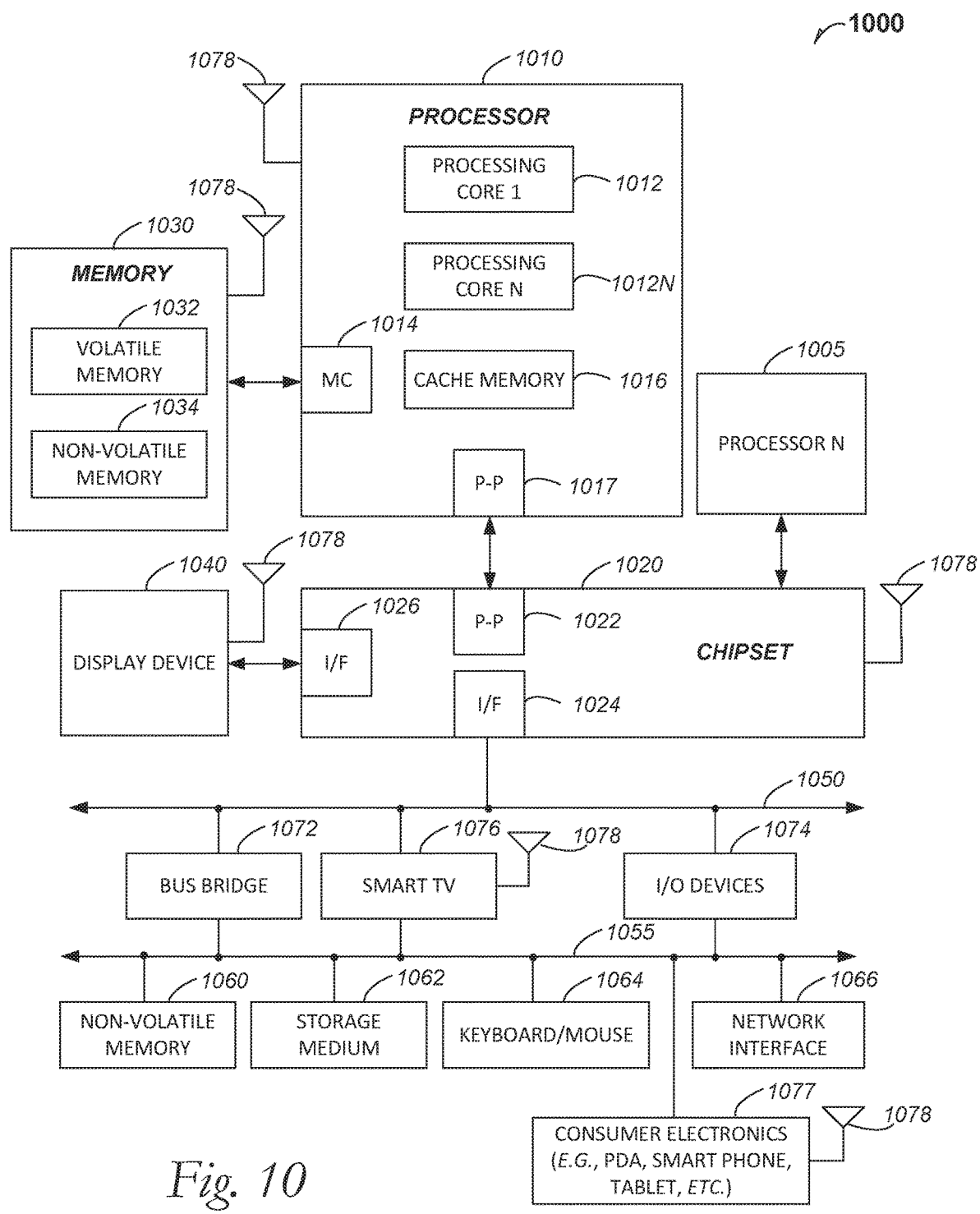
FIG. 10 is included to show an example of a higher-level device application for the disclosed embodiments.

FIG. 10 is included to show an example of a higher-level device application for the disclosed embodiments. The micro-trace containing package substrate embodiments may be found in several parts of a computing system. In an embodiment, the micro-trace containing package substrate embodiments can be part of a communications apparatus such as is affixed to a cellular communications tower. In an embodiment, a computing system 1000 includes, but is not limited to, a desktop computer. In an embodiment, a system 1000 includes, but is not limited to a laptop computer. In an embodiment, a system 1000 includes, but is not limited to a tablet. In an embodiment, a system 1000 includes, but is not limited to a notebook computer. In an embodiment, a system 1000 includes, but is not limited to a personal digital assistant (PDA). In an embodiment, a system 1000 includes, but is not limited to a server. In an embodiment, a system 1000 includes, but is not limited to a workstation. In an embodiment, a system 1000 includes, but is not limited to a cellular telephone. In an embodiment, a system 1000 includes, but is not limited to a mobile computing device. In an embodiment, a system 1000 includes, but is not limited to a smart phone. In an embodiment, a system 1000 includes, but is not limited to an internet appliance. Other types of computing devices may be configured with the microelectronic device that includes micro-trace containing package substrate embodiments.

In an embodiment, the processor 1010 has one or more processing cores 1012 and 1012N, where 1012N represents the Nth processor core inside processor 1010 where N is a positive integer. In an embodiment, the electronic device system 1000 using a micro-trace containing package substrate embodiment that includes multiple processors including 1010 and 1005, where the processor 1005 has logic similar or identical to the logic of the processor 1010. In an embodiment, the processing core 1012 includes, but is not limited to, pre-fetch logic to fetch instructions, decode logic to decode the instructions, execution logic to execute instructions and the like. In an embodiment, the processor 1010 has a cache memory 1016 to cache at least one of instructions and data for the multi-layer solder resist on a semiconductor device package substrate in the system 1000. The cache memory 1016 may be organized into a hierarchical structure including one or more levels of cache memory.

In an embodiment, the processor 1010 includes a memory controller 1014, which is operable to perform functions that enable the processor 1010 to access and communicate with memory 1030 that includes at least one of a volatile memory 1032 and a non-volatile memory 1034. In an embodiment, the processor 1010 is coupled with memory 1030 and chipset 1020. In an embodiment, the chipset 1020 is part of a micro-trace containing package substrate embodiment depicted in FIG. 2. The processor 1010 may also be coupled to a wireless antenna. 1078 to communicate with any device configured to at least one of transmit and receive wireless signals. In an embodiment, the wireless antenna interface 1078 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1034 includes, but is not limited to, flash memory, phase change memory (PCM), read-only memory (ROM), electrically erasable programmable read-only memory (EEPROM), or any other type of non-volatile memory device.

The memory 1030 stores information and instructions to be executed by the processor 1010. In an embodiment, the memory 1030 may also store temporary variables or other intermediate information while the processor 1010 is executing instructions. In the illustrated embodiment, the chipset 1020 connects with processor 1010 via Point-to-Point (PtP or P-P) interfaces 1017 and 1022. Either of these PtP embodiments may be achieved using a micro-trace containing package substrate embodiment as set forth in this disclosure. The chipset 1020 enables the processor 1010 to connect to other elements in a micro-trace containing package substrate embodiment in a system 1000. In an embodiment, interfaces 1017 and 1022 operate in accordance with a PtP communication protocol such as the Intel® QuickPath Interconnect (QPI) or the like. In other embodiments, a different interconnect may be used.

In an embodiment, the chipset 1020 is operable to communicate with the processor 1010, 1005N, the display device 1040, and other devices 1072, 1076, 1074, 1060, 1062, 1064, 1066, 1077, etc. The chipset 1020 may also be coupled to a wireless antenna 1078 to communicate with any device configured to at least do one of transmit and receive wireless signals.

The chipset 1020 connects to the display device 1040 via the interface 1026. The display 1040 may be, for example, a liquid crystal display (LCD), a plasma display, cathode ray tube (CRT) display, or any other form of visual display device. In an embodiment, the processor 1010 and the chipset 1020 are merged into a micro-trace containing package substrate embodiment in a system. Additionally, the chipset 1020 connects to one or more buses 1050 and 1055 that interconnect various elements 1074, 1060, 1062, 1064, and 1066. Buses 1050 and 1055 may be interconnected together via a bus bridge 1072 such as at least one micro-trace containing package substrate embodiment. In an embodiment, the chipset 1020, via interface 1024, couples with a non-volatile memory 1060, a mass storage device(s) 1062, a keyboard/mouse 1064, a network interface 1066, smart TV 1076, and the consumer electronics 1077, etc.

In an embodiment, the mass storage device 1062 includes, but is not limited to, a solid-state drive, a hard disk drive, a universal serial bus flash memory drive, or any other form of computer data storage medium. In one embodiment, the network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 10 are depicted as separate blocks within the micro-trace containing package substrate embodiments in a computing system 1000, the functions performed by some of these blocks may be integrated within a single semiconductor circuit or may be implemented using two or more separate integrated circuits. For example, although cache memory 1016 is depicted as a separate block within processor 1010, cache memory 1016 (or selected aspects of 1016) can be incorporated into the processor core 1012.

To illustrate the micro-trace containing package substrate embodiments and methods disclosed herein, a non-limiting list of examples is provided herein:

Example 1 is a semiconductor package substrate comprising: a VCC via between a VCC top trace and a VCC bottom trace; a VSS via between a VSS top trace and a VSS bottom trace, wherein the VSS via is adjacent the VCC via; a micro trace that contacts only one of the VCC via and VSS via, wherein the micro trace is between the VCC and VSS top traces and the VCC and VSS bottom traces, and wherein the micro trace is thinner than any of the VSS and VCC top traces and the VSS and VCC bottom traces; and a mica dielectric layer contacting the micro trace, wherein the micro dielectric layer contacts one of the VCC and VSS top traces and the VCC and VSS bottom traces.

In Example 2, the subject matter of Example 1 optionally includes wherein micro trace is closer to the VSS and VCC bottom traces than to the VSS and VCC top traces.

In Example 3, the subject matter of any one or more of Examples 1-2 optionally include wherein micro trace is closer to the VSS and VCC top traces than to the VSS and VCC bottom traces.

In Example 4, the subject matter of any one or more of Examples 1-3 optionally include wherein the semiconductor package substrate includes a die side and a land side, wherein the micro trace is closer to the land side than to the die side, further including a capacitor on the die side.

In Example 5, the subject matter of any one or more of Examples 1-4 optionally include wherein the semiconductor package substrate includes a die side and a land side, wherein the micro trace is closer to the land side than to the die side, further including: a capacitor on the die side; and a semiconductive device on the die side, wherein the micro trace couples the capacitor to the semiconductive device.

In Example 6, the subject matter of any one or more of Examples 1-5 optionally include wherein the semiconductor package substrate includes a die side and a land side, wherein the micro trace is closer to the land side than to the die side, further including: a capacitor on the die side; a semiconductive device on the die side, wherein the micro trace couples the capacitor to the semiconductive device; and a memory-die on the die side, wherein the memory die is between the semiconductive device and the capacitor, and wherein a keep-out zone is between the memory die and the capacitor.

In Example 7, the subject matter of any one or more of Examples 1-6 optionally include wherein the semiconductor package substrate includes a die side and a land side, wherein the micro trace is closer to the land side than to the die side, further including: a capacitor on the die side; and a semiconductive device on the die side, wherein the micro trace couples the capacitor to the semiconductive device, and wherein the micro trace is closer to the VCC and VSS top traces than to the VCC and VSS bottom traces.

In Example 8, the subject matter of any one or more of Examples 1-7 optionally include wherein the semiconductor package substrate includes a die side and a land side, wherein the micro trace is closer to the land side than to the die side, further including: a capacitor on the die side; and a semiconductive device on the die side, wherein the micro trace couples the capacitor to the semiconductive device, and wherein the micro trace is closer to the VCC and VSS bottom traces than to the VCC and VSS top traces.

In Example 9, the subject matter of any one or more of Examples 1-8 optionally include wherein the semiconductor package substrate includes a die side and a land side, wherein the micro trace is closer to the die side than to the land side, further including a capacitor on the die side.

In Example 10, the subject matter of any one or more of Examples 1-9 optionally include wherein the semiconductor package substrate includes a die side and a land side, wherein the micro trace is closer to the die side than to the land side, further including: a capacitor on the die side; and a semiconductive device on the die side, wherein the micro trace couples the capacitor to the semiconductive device.

In Example 11, the subject matter of any one or more of Examples 1-10 optionally include wherein the semiconductor package substrate includes a die side and a land side, wherein the micro trace is closer to the die side than to the land side, further including: a capacitor on the die side; a semiconductive device on the die side, wherein the micro trace couples the capacitor to the semiconductive device; and a memory-die on the die side, wherein the memory die is between the semiconductive device and the capacitor, and wherein a keep-out zone is between the memory die and the capacitor.

In Example 12, the subject matter of any one or more of Examples 1-11 optionally include wherein the semiconductor package substrate includes a die side and a land side, wherein the micro trace is closer to the die side than to the land side, further including: a capacitor on the die side; and a semiconductive device on the die side, wherein the micro trace couples the capacitor to the semiconductive device, and wherein the micro trace is closer to the VCC and VSS top traces than to the VCC and VSS bottom traces.

In Example 13, the subject matter of any one or more of Examples 1-12 optionally include wherein the semiconductor package substrate includes a die side and a land side, wherein the micro trace is closer to the die side than to the land side, further including: a capacitor on the die side; and a semiconductive device on the die side, wherein the micro trace couples the capacitor to the semiconductive device, and wherein the micro trace is closer to the VCC and VSS bottom traces than to the VCC and VSS top traces.

In Example 14, the subject matter of any one or more of Examples 1-13 optionally include wherein the semiconductor package substrate includes a die side and a land side, further including: a capacitor on the die side; a semiconductive device on the die side, wherein the micro trace couples the capacitor to the semiconductive device; and a keep-out zone between the capacitor and the semiconductive device.

In Example 15, the subject matter of any one or more of Examples 1-14 optionally include wherein the semiconductor package substrate includes a die side and a land side, further including: a capacitor on the die side; a first semiconductive device on the die side, wherein the micro trace couples the capacitor to the semiconductive device; a subsequent semiconductive device on the die side adjacent the first semiconductive device; and a keep-out zone between the capacitor and the semiconductive device.

In Example 16, the subject matter of any one or more of Examples 1-15 optionally include wherein the semiconductor package substrate includes a die side and a land side, further including; a capacitor on the die side; a semiconductive device on the die side, wherein the micro trace couples the capacitor to the semiconductive device; a first thermal die adjacent the semiconductive device, wherein the micro trace is coupled to the first thermal die by a metal-insulator-metal layer; and a subsequent thermal die adjacent the semiconductive device and across from the first thermal die, wherein the micro trace is coupled to the subsequent thermal die by a metal-insulator-metal layer.

Example 17 is a process of assembling a semiconductor package substrate, comprising; configuring a dielectric layer with a micro trace by curing and thinning dielectric material; coupling the micro trace to one of a VCC DC via and a VSS DC via, wherein the VCC DC via and the VSS DC via are adjacent to each other; forming a VCC DC top trace to the VCC DC via; and forming a VSS DC top trace to the VSS DC via.

In Example 18, the subject matter of Example 17 optionally includes wherein the micro trace is in the semiconductor package substrate, wherein the semiconductor package substrate includes a die side and a land side, further including assembling a capacitor on the die side, and wherein the capacitor is coupled to the micro trace.

In Example 19, the subject matter of any one or more of Examples 17-18 optionally include wherein the micro trace is in the semiconductor package substrate, wherein the semiconductor package substrate includes a die side and a land side, further including: assembling a capacitor on the die side, and wherein the capacitor is coupled to the micro trace; and assembling a semiconductive device on the die side, and wherein the capacitor is coupled to the semiconductive device through the micro trace.

Example 20 is a computing system, comprising: semiconductor package substrate including a die side and a land side; a VCC via in the semiconductor package substrate, wherein the VCC via is between a VCC top trace and a VCC bottom trace; a VSS via in the semiconductor package substrate, wherein the VSS via is between a VSS top trace and a VSS bottom trace, wherein the VSS via is adjacent the VCC via; a micro trace that contacts only one of the VCC via and VSS via, wherein the micro trace is between the VCC and VSS top traces and the VCC and VSS bottom traces, and wherein the micro trace is thinner than any of the VSS and VCC top traces and the VSS and VCC bottom traces; a mica dielectric layer contacting micro trace, wherein the micro dielectric layer contacts one of the VCC and VSS top traces, and the VCC and VSS bottom traces; a capacitor on the die side, wherein the capacitor is coupled to the micro trace; a semiconductive device on the die side, wherein the semiconductive device is coupled to the micro trace; and wherein the semiconductive device is part of a chipset.

In Example 21, the subject matter of Example 20 optionally includes an electrical bump array on the land side; and a board that contacts the electrical bump array, and wherein the board in includes a shell.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can in include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package substrate comprising:
   a VCC via between a VCC top trace and a VCC bottom trace;
   a VSS via between a VSS top trace and a VSS bottom trace, wherein the VSS via is adjacent the VCC via;
   a micro trace that contacts only one of the VCC via and VSS via, wherein the micro trace is between the VCC and VSS top traces and the VCC and VSS bottom traces, and wherein the micro trace is thinner than any of the VSS and VCC top traces and the VSS and VCC bottom traces; and
   a micro dielectric layer contacting the micro trace, wherein the micro dielectric layer contacts one of the VCC and VSS top traces and the VCC and VSS bottom traces.

2. The semiconductor package substrate of claim 1, wherein micro trace is closer to the VSS and VCC bottom traces than to the VSS and VCC top traces.

3. The semiconductor package substrate of claim 1, wherein micro trace is closer to the VSS and VCC top traces than to the VSS and VCC bottom traces.

4. The semiconductor package substrate of claim 1, wherein the semiconductor package substrate includes a die side and a land side, wherein the micro trace is closer to the land side than to the die side, further including a capacitor on the die side.

5. The semiconductor package substrate of claim 1, wherein the semiconductor package substrate includes a die side and a land side, wherein the micro trace is closer to the land side than to the die side, further including:
   a capacitor on the die side; and
   a semiconductive device on the die side, wherein the micro trace couples the capacitor to the semiconductive device.

6. The semiconductor package substrate of claim 1, wherein the semiconductor package substrate includes a die side and a land side, wherein the micro trace is closer to the land side than to the die side, further including:
   a capacitor on the die side;
   a semiconductive device on the die side, wherein the micro trace couples the capacitor to the semiconductive device; and
   a memory-die on the die side, wherein the memory die is between the semiconductive device and the capacitor, and wherein a keep-out zone is between the memory die and the capacitor.

7. The semiconductor package substrate of claim 1, wherein the semiconductor package substrate includes a die side and a land side, wherein the micro trace is closer to the land side than to the die side, further including:
   a capacitor on the die side; and
   a semiconductive device on the die side, wherein the micro trace couples the capacitor to the semiconductive device, and wherein the micro trace is closer to the VCC and VSS top traces than to the VCC and VSS bottom traces.

8. The semiconductor package substrate of claim 1, wherein the semiconductor package substrate includes a die side and a land side, wherein the micro trace is closer to the land side than to the die side, further including:
   a capacitor on the die side; and
   a semiconductive device on the die side, wherein the micro trace couples the capacitor to the semiconductive device, and wherein the micro trace is closer to the VCC and VSS bottom traces than to the VCC and VSS top traces.

9. The semiconductor package substrate of claim 1, wherein the semiconductor package substrate includes a die side and a land side, wherein the micro trace is closer to the die side than to the land side, further including a capacitor on the die side.

10. The semiconductor package substrate of claim 1, wherein the semiconductor package substrate includes a die side and a land side, wherein the micro trace is closer to the die side than to the land side, further including:
    a capacitor on the die side; and
    a semiconductive device on the die side, wherein the micro trace couples the capacitor to the semiconductive device.

11. The semiconductor package substrate of claim 1, wherein the semiconductor package substrate includes a die side and a land side, wherein the micro trace is closer to the die side than to the land side, further including:
    a capacitor on the die side;
    a semiconductive device on the die side, wherein the micro trace couples the capacitor to the semiconductive device; and
    a memory-die on the die side, wherein the memory die is between the semiconductive device and the capacitor, and wherein a keep-out zone is between the memory die and the capacitor.

12. The semiconductor package substrate of claim 1, wherein the semiconductor package substrate includes a die side and a land side, wherein the micro trace is closer to the die side than to the land side, further including:
    a capacitor on the die side; and
    a semiconductive device on the die side, wherein the micro trace couples the capacitor to the semiconductive device, and wherein the micro trace is closer to the VCC and VSS top traces than to the VCC and VSS bottom traces.

13. The semiconductor package substrate of claim 1, wherein the semiconductor package substrate includes a die side and a land side, wherein the micro trace is closer to the die side than to the land side, further including:
    a capacitor on the die side; and
    a semiconductive device on the die side, wherein the micro trace couples the capacitor to the semiconductive device, and wherein the micro trace is closer to the VCC and VSS bottom traces than to the VCC and VSS top traces.

14. The semiconductor package substrate of claim 1, wherein the semiconductor package substrate includes a die side and a land side, further including:
    a capacitor on the die side;
    a semiconductive device on the die side, wherein the micro trace couples the capacitor to the semiconductive device; and
    a keep-out zone between the capacitor and the semiconductive device.

15. The semiconductor package substrate of claim 1, wherein the semiconductor package substrate includes a die side and a land side, further including:
    a capacitor on the die side;
    a first semiconductive device on the die side, wherein the micro trace couples the capacitor to the semiconductive device;
    a subsequent semiconductive device on the die side adjacent the first semiconductive device; and
    a keep-out zone between the capacitor and the semiconductive device.

16. The semiconductor package substrate of claim 1, wherein the semiconductor package substrate includes a die side and a land side, further including:
    a capacitor on the die side;
    a semiconductive device on the die side, wherein the micro trace couples the capacitor to the semiconductive device;
    a first thermal die adjacent the semiconductive device, wherein the micro trace is coupled to the first thermal die by a metal-insulator-metal layer; and
    a subsequent thermal die adjacent the semiconductive device and across from the first thermal die, wherein the micro trace is coupled to the subsequent thermal die by a metal-insulator-metal layer.

17. A computing system, comprising:
    semiconductor package substrate including a die side and a land side;
    a VCC via in the semiconductor package substrate, wherein the VCC via is between a VCC top trace and a VCC bottom trace;

a VSS via in the semiconductor package substrate, wherein the VSS via is between a VSS top trace and a VSS bottom trace, wherein the VSS via is adjacent the VCC via;

a micro trace that contacts only one of the VCC via and VSS via, wherein the micro trace is between the VCC and VSS top traces and the VCC and VSS bottom traces, and wherein the micro trace is thinner than any of the VSS and VCC top traces and the VSS and VCC bottom traces;

a micro dielectric layer contacting the micro trace, wherein the micro dielectric layer contacts one of the VCC and VSS top traces, and the VCC and VSS bottom traces;

a capacitor on the die side, wherein the capacitor is coupled to the micro trace;

a semiconductive device on the die side, wherein the semiconductive device is coupled to the micro trace; and wherein the semiconductive device is part of a chipset.

18. The computing system of claim 17, further including:

an electrical bump array on the land side; and a board that contacts the electrical bump array, and wherein the board includes a shell.

* * * * *